(12) United States Patent
Wilson et al.

(10) Patent No.: US 7,602,646 B1
(45) Date of Patent: Oct. 13, 2009

(54) THRESHOLD EVALUATION OF EPROM CELLS

(75) Inventors: Paul Wilson, Linlithgow (GB); Roel van Ettinger, Bathgate (GB)

(73) Assignee: Micrel, Incorporated, San Jose, CA (US)

( * ) Notice: Subject to any disclaimer, the term of this patent is extended or adjusted under 35 U.S.C. 154(b) by 89 days.

(21) Appl. No.: 12/056,570

(22) Filed: Mar. 27, 2008

(51) Int. Cl.
*G11C 16/04* (2006.01)

(52) U.S. Cl. .............................. 365/185.18; 365/185.2; 365/185.09; 365/185.02

(58) Field of Classification Search ............ 365/185.18, 365/185.2, 185.09, 185.02
See application file for complete search history.

(56) References Cited

U.S. PATENT DOCUMENTS 6,707,718 B1 * 3/2004 Halim et al. ............ 365/185.18
7,200,058 B2 * 4/2007 Mochizuki ............. 365/185.18

* cited by examiner

*Primary Examiner*—Huan Hoang
(74) *Attorney, Agent, or Firm*—Bever, Hoffman & Harms, LLP; Patrick T. Bever

(57) ABSTRACT

Evaluating an embedded EPROM in a host IC device involves using program circuitry to program/unprogram all of the floating-gate cells of the embedded EPROM, then simultaneously transmitting a predetermined test bias voltage to all of the programmed/unprogrammed floating-gate cells, and then evaluating the output terminals of all of the floating-gate cells using a logic (e.g., wired NOR or NAND) circuit, whereby successful operation of all of the embedded EPROM cells causes the wired logic circuit to generate a single positive test result signal, and the failure of one or more of the embedded EPROM cells causes the wired logic circuit to generate a single negative test signal. A reference cell is also evaluated using a bias testing circuit to determine that the reference voltage supplied during normal operation is at an acceptable voltage level.

10 Claims, 5 Drawing Sheets

US 7,602,646 B1

THRESHOLD EVALUATION OF EPROM CELLS

FIELD OF THE INVENTION

This invention relates to integrated circuit (IC) devices having embedded EPROMs in ICs, and more particularly to efficient methods for evaluating the threshold voltages of floating-gate cells in embedded EPROMs.

BACKGROUND OF THE INVENTION

FIG. 9 is a simplified cross-sectional view showing an exemplary conventional floating-gate transistor (cell) 50 formed on a silicon substrate 51 using, e.g., conventional CMOS fabrication techniques. Floating-gate cell 50 includes an N+ doped source region S and an N+ doped drain region D that are formed in substrate 51 and are separated by a P-type channel region C. Formed over substrate 51 is a gate oxide layer 53, a polycrystalline silicone (polysilicon) floating gate FG disposed on gate oxide layer 53, an a control gate CG that is separated from floating gate FG by a second oxide layer 55. Oxide layers 53 and 55 completely surround floating gate FG, so that floating gate FG is electrically isolated. Program and erase (unprogram) operations are usually performed using Fowler-Nordheim Tunneling or Hot-Carrier Injection mechanisms that are known in the art, and are not relevant to the present invention. The resulting charge applied to floating gate FG during a program or erase operation is trapped on floating gate FG for long periods of time, even when power is turned off, thus making floating gate cells "non-volatile".

FIG. 9 indicates voltages and signals generated during a read operation in which the programmed/unprogrammed state of floating-gate cell 50 is selectively determined, whereby the "data" stored on floating-gate cell 50 is "read". The read operation involves applying a bias voltage $V_{BIAS}$ to control gate CG, and measuring voltage drop between drain region D and source region S, e.g., by coupling source region S to a ground potential, and measuring output signal $V_{OUT}$ at drain region D. Ideally, bias voltage $V_{BIAS}$ is higher than the threshold voltage of floating-gate cell 50 when it is unprogrammed, but lower than the threshold of floating-gate cell 50 when it is programmed. That is, when floating gate FG is programmed, the combined electric field generated by control gate CG (under the influence of bias voltage $V_{BIAS}$) and floating gate FG is insufficient to pass current from drain region D to source region S, whereby output signal $V_{OUT}$ remains high. Conversely, when floating gate FG is unprogrammed, the combined electric field generated by control gate CG (under the influence of bias voltage $V_{BIAS}$) and floating gate FG is sufficient to pass current from source region S to drain region D, whereby output signal $V_{OUT}$ is low.

Floating-gate cells are best known for storing large amounts of data in dedicated non-volatile memory devices such as Erasable Programmable Read-Only Memory (EPROM) devices, Electrically Erasable Programmable Read-Only Memory (EEPROM) devices and "flash" memory devices. However, smaller numbers of floating-gate cells are often incorporated into many types of otherwise "volatile" IC circuits to store trim, configuration and other data associated with a desired operation of the IC device. Such smaller numbers of floating-gate cells are often referred to as being "embedded", and are collectively referred to herein as "embedded EPROM".

Embedded EPROMs typically require special process steps that are not part of standard CMOS process flows, and as such the embedded EPROMs must be tested to assure that they function properly (i.e., as described above). However, as the number of functions designed into an IC device increases, the number of input-output pins (I/O pins) of the IC device also increases correspondingly, and it is often not desirable or feasible to increase the pin count of an IC device to perform special functions, such as testing a relatively small number of floating-gate cells associated with an embedded EPROM. The pin count of an IC device is often limited by the size and design of IC packages in which the IC chip is assembled. A large pin count increases the size and the cost for packaging the IC. Therefore, there is often a limit on the amount of I/O pins an IC has to perform all of the functions required to both test and operate the IC.

What is needed is a test system and method for evaluating embedded EPROMs that avoids the need for additional I/O pins and minimizes test time.

SUMMARY OF THE INVENTION

The present invention is directed to a test system and method for evaluating an embedded EPROM in a host IC device in which a predetermined bias voltage is simultaneously transmitted to all of the floating-gate cells of the embedded EPROM, and the output terminals of all of the floating-gate cells are connected to a wired logic (e.g., NOR or NAND) circuit, whereby successful operation of all of the embedded EPROM cells causes the wired logic circuit to generate a single positive test result signal, and the failure of one or more of the embedded EPROM cells causes the wired logic circuit to generate a single negative test signal. By providing a test structure that allows all of the floating-gate cells to be tested simultaneously and to generate a single test signal, the present invention minimizes both on-chip circuitry and the number of I/O pins required to perform the test operation. Accordingly, the present invention provides a convenient method for quickly and efficiently identifying problematic embedded EPROMs (i.e., screening for low threshold margins which results in short life span), thereby preventing the undesirable sale of defective host IC devices.

In accordance with an aspect of the present invention, for characterization purposes (i.e., the initial evaluation of a correct design implementation), the bias voltage supplied to the embedded EPROM cells during testing is varied by means of varying the supply voltage transmitted onto the host IC device. This varied bias voltage method enables a more accurate evaluation of programmed and unprogrammed threshold voltages and an accurate measurement of the upgrogrammed/programmed "charge" of the embedded EPROM cells without requiring the use of additional device pins. However, for production (high volume) testing where the varied bias voltage method may take too much time to be practical, a single measurement "go/no-go" test method is utilized that involves applying a fixed predetermined bias voltage (through the system supply $V_{DD}$) and reading the output signal.

In accordance with an embodiment of the present invention, in addition to evaluating the embedded EPROM cell evaluation described above, the bias voltage generated by a reference FG cell is also evaluated. During "normal" operation, the bias voltage is supplied to control gates of all of the embedded EPROM cells, so it must be within a specified voltage range. The bias voltage evaluation involves coupling the bias voltage generated by the reference FG cell to a bias testing circuit, which compares the bias voltage against one or more predetermined reference voltages. In a manner similar to that used to evaluate the embedded EPROM cells, the actual embedded bias voltage used during a read cycle can also be evaluated either using a varied supply voltage, or, during production testing, using one or more fixed supply voltages.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to improvements in evaluating embedded EPROMs. The following description is presented to enable one of ordinary skill in the art to make and use the invention as provided in the context of a particular application and its requirements. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
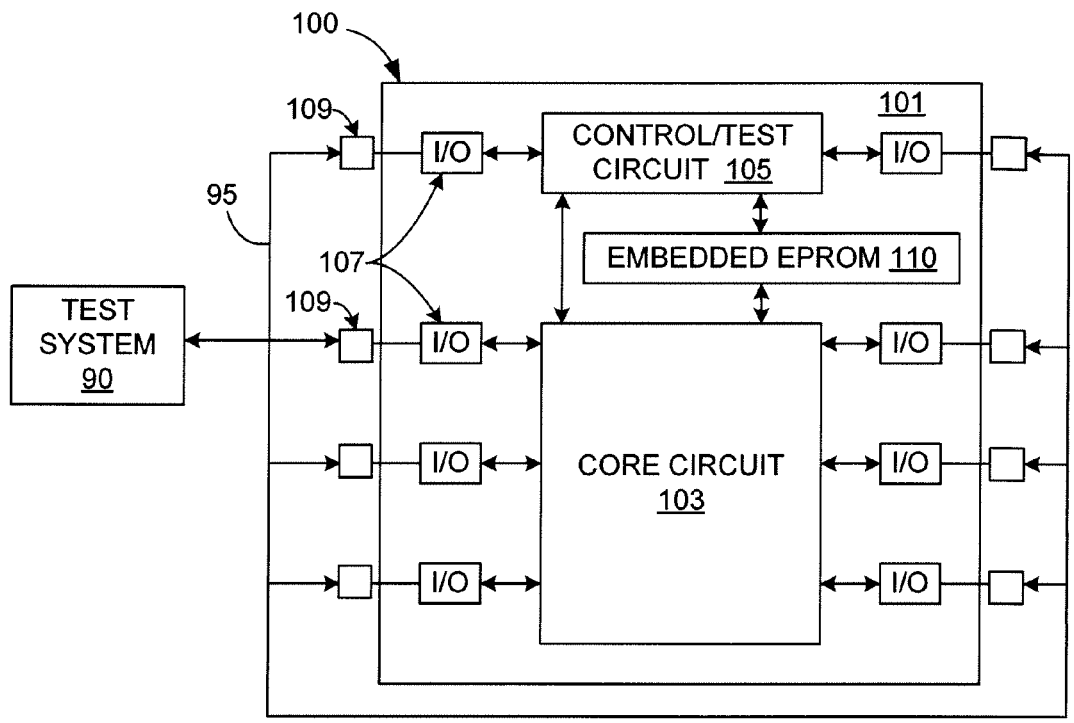
FIG. 1 is a simplified diagram showing an integrated circuit including an embedded EPROM during a test procedure according to an embodiment of the present invention.

FIG. 1 is a simplified diagram showing an integrated circuit (IC) 100 during a test procedure conducted by a test system 90 according to an embodiment of the present invention. C 100 is fabricated on a monolithic semiconductor (e.g., monocrystalline silicon) substrate ("chip") 101 and includes a core (e.g., a DC-to-DC converter or a low dropout regulator (LDO) circuit) circuit 103, a control/test circuit 105, several input/output (I/O) circuits 107, and several external pins 109. Core circuit 103 performs the main function provided by IC 100 by way of signals transmitted from an external source by way of external pins 109 and selected I/O pins 107. Control/test circuit 105 facilitates testing of core circuit 105, and is connected to selected external pins 109 by way of associated I/O pins 107. Test system 90 includes multiple probes (indicated by arrows) that facilitate communication between test system 90 and IC 100 during a test procedure performed prior to sale or other end use of IC 100. Test system 90 transmits predetermined control and data test signals to IC 100, and analyzes the resulting data output from IC 100 in order to identify defective devices. Test systems similar to those utilized to implement test system 90 are well-known to those skilled in the art, and programming or other reconfiguration of such conventional test systems to implement the evaluation (test) procedure described herein will be apparent to those skilled in the art.

According to an aspect of the present invention, IC 100 includes an embedded EPROM 110 that is utilizes to store trim and configuration data used during the normal operation of core circuit 103. In accordance with the present invention, control/test circuit 105 includes various circuits that, in cooperation with test system 90, perform a test procedure (method) to evaluate the threshold voltages of each cell of embedded EPROM 110, whereby defective EPROM cells (i.e., those that do not reproduce the intended stored data during normal operation) can be identified a manner that avoids the need for additional I/O pins 109 and minimizes test time. As such, the present invention provides a convenient method for quickly and efficiently identifying problematic (defective) embedded EPROMs in order to prevent the undesirable sale or implementation of the host IC devices in which the defective embedded EPROMs reside.

Figure 2:
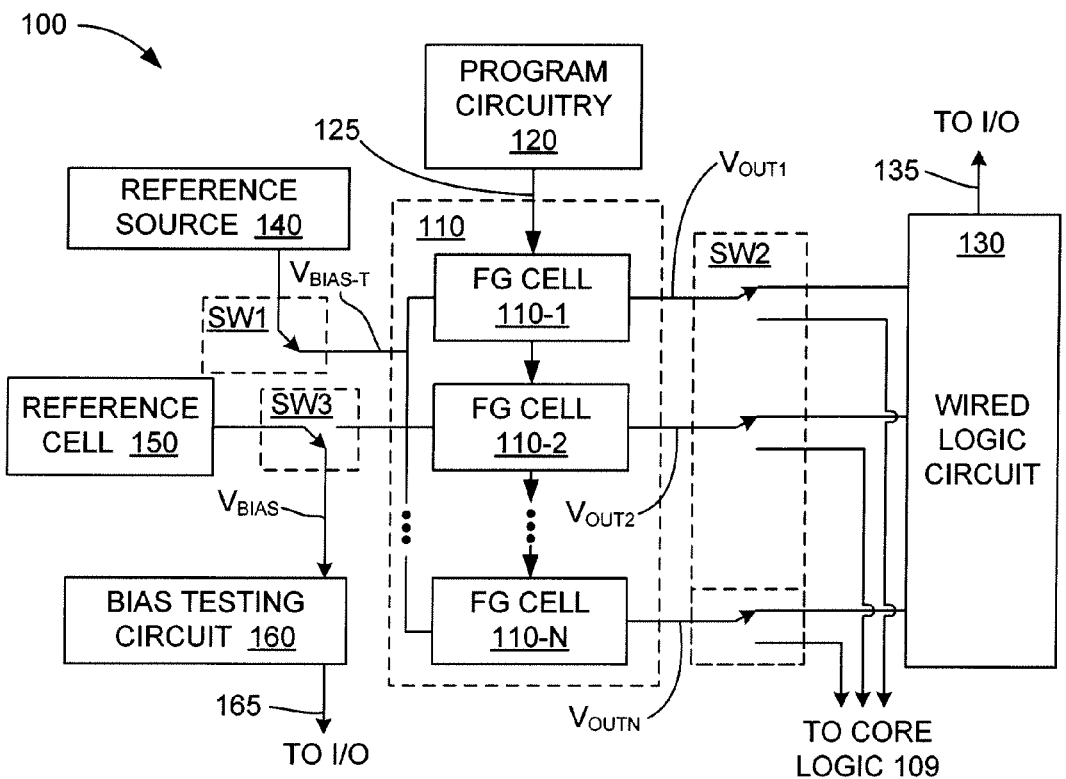
FIG. 2 is a simplified block diagram showing a portion of the IC of FIG. 1 as configured to perform the test procedure of FIG. 1.
Figure 9:
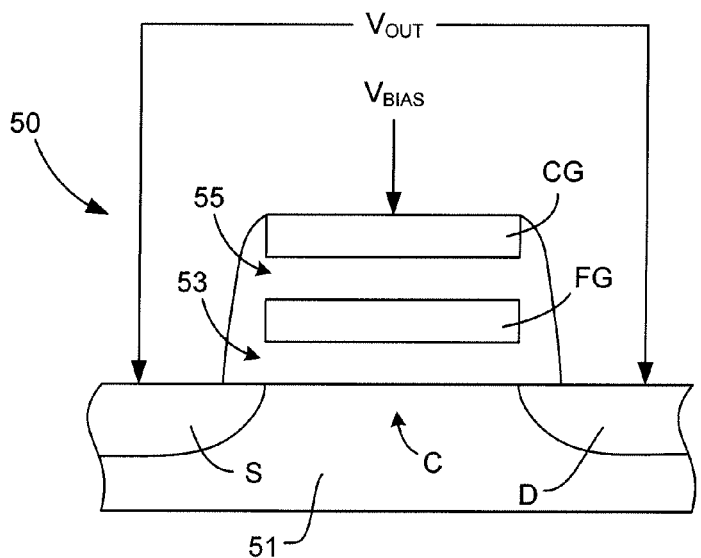
FIG. 9 is a simplified cross-sectional view showing an exemplary conventional floating-gate transistor.

Referring to FIG. 2, embedded EPROM 110 includes multiple floating-gate (FG) cells 110-1 to 110-N, each including a floating gate transistor similar to that described above with reference to FIG. 9. To facilitate the test procedure and normal operation of FG cells 110-1 to 110-N, control/test circuit 105 (FIG. 1) includes program circuitry 120, one or more wired logic circuits 130, a reference source circuit 140, a reference cell 150, and a bias testing circuit 160. Program circuitry 120 is utilizes to set the programmed/unprogrammed state of FG cells 110-1 to 110-N during the test procedure of the present invention in the manner described below, but is otherwise implemented and functions according to known techniques. Each of the remaining circuits is selectively coupled to embedded EPROM 110 by way of switch circuits SW1 to SW3, and are utilized during the test procedure, and is described in additional detail below.

Figure 3:
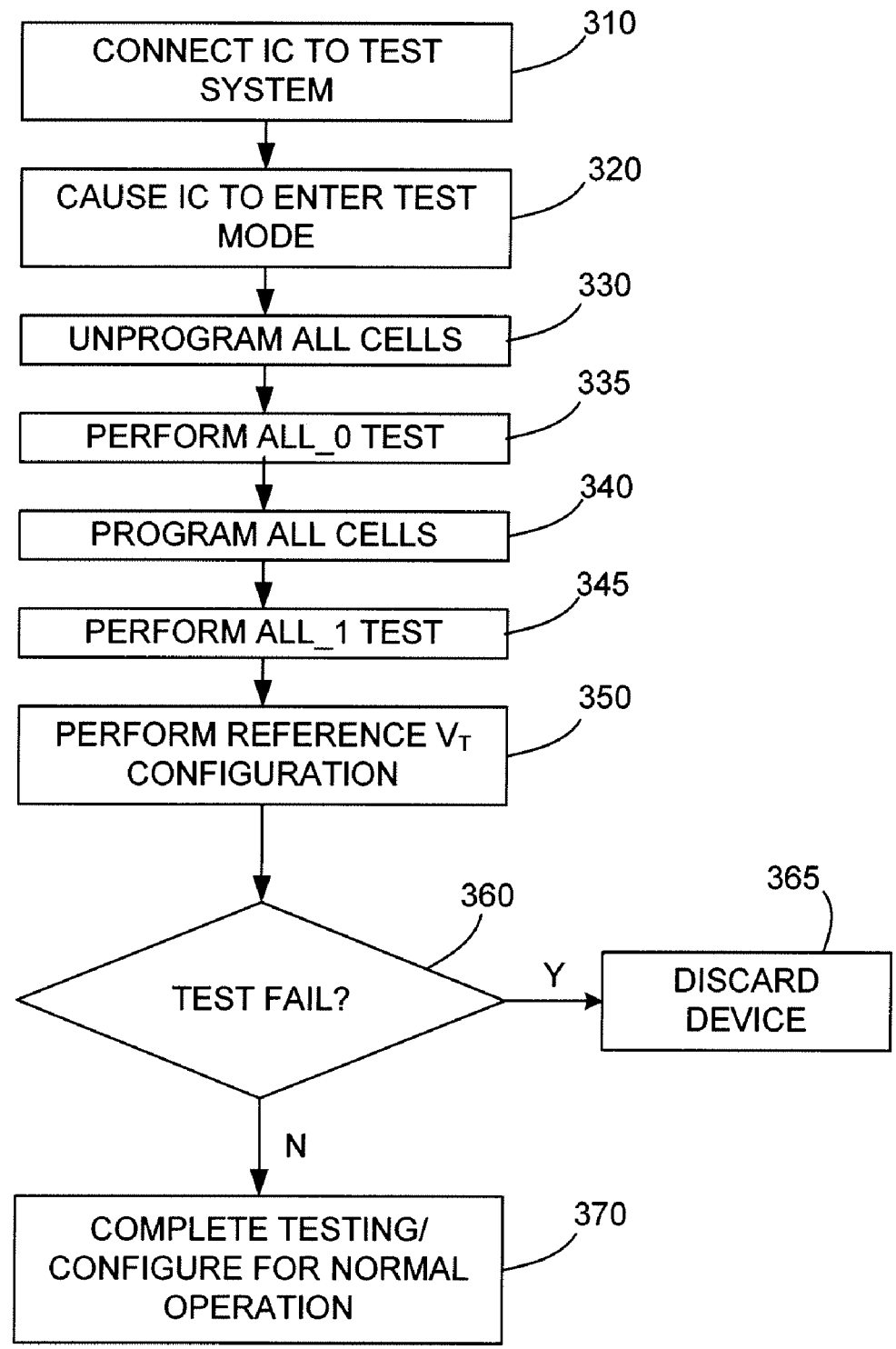
FIG. 3 is a flow diagram showing a test procedure according to a specific embodiment of the present invention.

FIG. 3 is a flow diagram illustrating a simplified test procedure implemented by test system 90 on IC 100 according to a specific embodiment of the present invention. Those skilled in the art will recognize that the order in which the process components are implemented may be varied. To initiate the test procedure, IC 100 is placed on a test pad or otherwise contacted by test probes in order to electrically connect test system 90 with IC 100 in the manner shown in FIG. 1 (block 310). After powering up IC 100, test system 90 transmits predetermined configuration signals to control/test circuit 105 that causes IC 100 to enter an embedded EPROM test mode (block 320). Program circuitry 120 is then controlled to unprogram (e.g., erase, or store a logic "0" in) all FG cells 110-1 to 110-N of embedded EPROM 110 (block 330). Next, control/test circuit 105 performs an "all 0" test according to the process described below with reference to FIG. 4 (block 335). Program circuitry 120 is then controlled to program (i.e., store a logic "1" in) all FG cells 110-1 to 110-N of embedded EPROM 110 (block 340), and then control/test circuit 105 performs an "all 1" test according to the process described below with reference to FIG. 5 (block 345). A reference threshold voltage ($V_T$) configuration procedure is then performed according to the process described below with reference to FIG. 6 (block 350). If any of the procedures/tests fails to yield a positive test result (Yes branch from block 360), test system 90 is notified and the failed device is discarded (block 365). Conversely, if all procedures/tests yield positive test results (No branch from block 360), testing and configuration of the target IC 100 is completed and the target IC is configured for "normal" operation (block 370).

As set forth above, program circuitry 120 is utilized to store a logic "1" into all of FG cells 110-1 to 110-N in order to perform the "all 1" test procedure, or to store a logic "0" into all of FG cells 110-1 to 110-N in order to perform the "all 0" test procedure. As is known to those skilled in the art, these data program/unprogram processes involve applying predetermined voltages (represented by arrow 125 in FIG. 2) to FG cells 110-1 to 110-N of embedded EPROM 110 such that the floating gate of each FG cell is subjected to a predetermined programming/unprogramming potential, and thereby assumes a programmed or unprogrammed state. The details of the program/unprogram process are not relevant to the present invention, and therefore are not described in additional detail herein for brevity.

In the specific embodiment set forth in FIG. 3, a three phase testing process (i.e., "all 0" test, "all 1" test, and reference $V_T$ test) is described for testing each IC 100. Performing all three of these processes is advisable to identify each type of defective FG cell. However, a test process may be performed including only one or two of these processes that identifies at least some defective FG cells. Moreover, the precise testing conditions described herein may be altered from that specifically described while remaining within the spirit and scope of the present invention. Accordingly, unless specifically recited in claims, the scope of the present invention is not intended to be limited by the specific procedures described herein.

The "all 0" test (block 335), "all 1" test (block 345), and threshold $V_T$ test (block 350) will now be introduced with reference to FIG. 2, and then described in detail with reference to FIGS. 4, 5 and 6, respectively.

Referring to FIG. 2, after FG cells 110-1 to 110-N are programmed/unprogrammed by way of program circuitry 120, switch SW1 is configured to couple a control gate of each FG cell 110-1 to 110-N to a selected test voltage $V_{BIAS-T}$, and switch SW2 is configured to couple an output terminal of each FG cell 110-1 to 110-N to an associated wired logic circuit 130. With all of FG cells 110-1 to 110-N coupled to test bias voltage $V_{BIAS-T}$, each FG cell transmits an output signal $V_{OUT1}$ to $V_{OUTN}$ to wired logic circuit 130 that is determined by the programmed change stored on its floating gate. In accordance with an aspect of the present invention, wired logic circuit 130 generates a single-bit cell test result signal 135 that has a "positive" (first) logic value (e.g., "1") when all of FG cells 110-1 to 110-N store the predetermined unprogrammed charge, and has a "negative" (second) logic value e.g., "0" when one or more of FG cells 110-1 to 110-N fails to store the predetermined unprogrammed charge. Single-bit cell test result signal 135 is then transmitted from IC 100 to test system 90 by way of a single external pin 109. By providing control/test 105 such that all FG cells 110-1 to 110-N are simultaneously tested and a single test signal is generated, the present invention minimizes both on-chip test circuitry and the number of I/O pins required to perform the test operation. Accordingly, the present invention provides a convenient method for quickly and efficiently identifying ICs 100 in which one or more FG cells of embedded EPROM 110 are defective, thereby preventing the undesirable sale of defective host IC devices.

As indicated in the lower left portion of FIG. 2, before or after the "all 1" and/or "all 0" test, switch SW3 is configured to couple a bias signal $V_{BIAS}$ generated by reference cell 150 to bias testing circuit 160. As described in detail below with reference to FIG. 6, bias testing circuit 160 compares bias signal $V_{BIAS}$ against two predetermined reference voltages, and generates single-bit bias test result signals 165 having a positive (first) logic value (e.g., "1") when reference cell 150 is operating properly (i.e., bias voltage $V_{BIAS}$ is within a predetermined voltage range), and having a negative (second) logic value (e.g., "0") when bias voltage $V_{BIAS}$ is generated at a deficient voltage level (i.e., less than or greater than the predetermined voltage range). The predetermined reference voltages are created from the supply voltage using one or more conventional resistor potential dividers. To test the correct level of the bias signal $V_{BIAS}$, two levels are subsequently applied and compared to the bias signal with use of comparator 163 (FIG. 6). These levels represent the predetermined extremes of the bias signal as allowed by design. The higher and lower level should yield a logic "1" respectively a logic "0" on the I/O line 165 which during this test is passed on to test system 90 using signal 109. Failure to do so signifies the bias to be outside the levels on which basis the part will fail the test.

Figure 4:
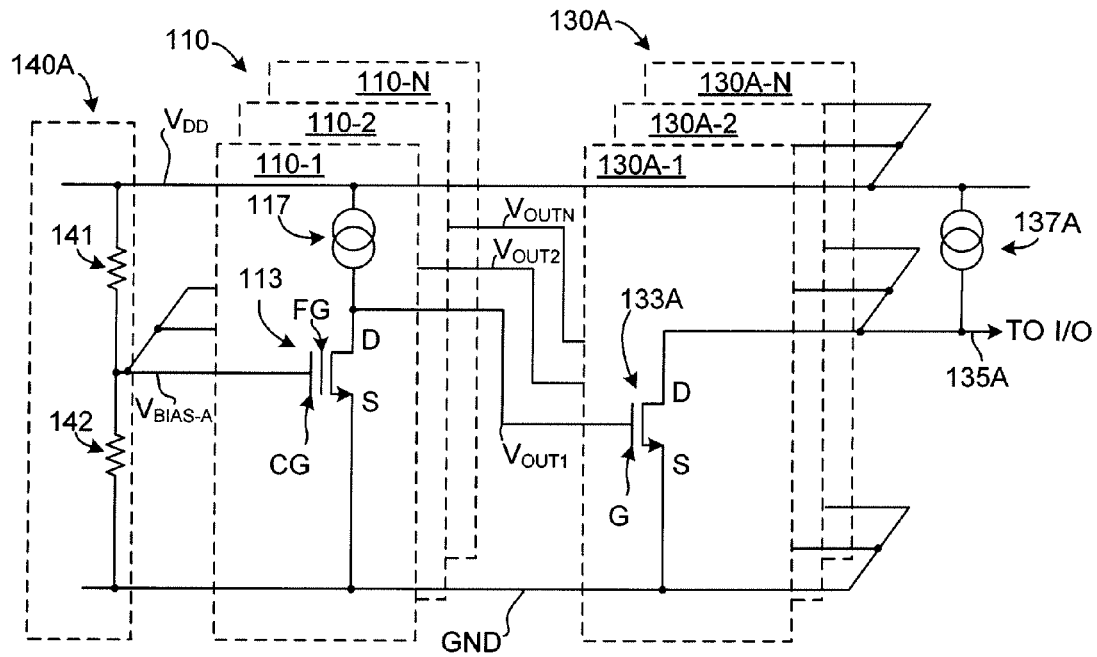
FIG. 4 is a simplified circuit diagram depicting a portion of the IC of FIG. 2 during a first portion of the test procedure of FIG. 3.

FIG. 4 shows a first configuration of IC 100 during the "all 0" test, which is to evaluate the worst case unprogrammed threshold voltage of all FG cells 110-1 to 110-N. In this embodiment, a reference source 140A is implemented using a voltage divider from the power supply formed by resistors 141 and 142 to produce a desired reference bias voltage $V_{BIAS-A}$ that is transmitted to each FG cell 110-1 to 110-N by way of switch SW1 (which is shown in FIG. 2, but omitted in FIG. 4 for clarity). Each FG cell (e.g., FG cell 110-1) includes an FG transistor 113 having a floating gate FG, a control gate CG coupled to receive reference bias voltage $V_{BIAS-A}$, a drain D connected to system voltage $V_{DD}$ by way of a current source 117, and a source S connected to a ground potential GND. Note that system voltage $V_{DD}$ is supplied by test system 90 (shown in FIG. 1) during the test process. To perform the "all 0" test, wired logic circuit 130A comprises a wired NOR gate 130A having multiple gates 130A-1 to 130A-N, each corresponding to an associated FG cell 110-1 to 110-N of embedded EPROM 110. Each gate 130A-1 to 130A-N (e.g., gate 130A-1) includes a transistor (e.g., 133A) having a gate terminal G coupled to the drain D of an associated FG cell (e.g., 110-1), a source S connected to ground potential GND, and a drain D connected to a common node 135A, which is connected to system voltage $V_{DD}$ by way of a shared current source 137A. Under these conditions, with all of FG cells 110-1 to 110-N coupled to test bias voltage $V_{BIAS-A}$, each FG cell transmits an output signal $V_{OUT1}$ to $V_{OUTN}$ to wired NOR circuit 130A that is determined by the unprogrammed charge stored on its floating gate FG, and wired NOR circuit 130A generates a "positive" single-bit cell test result signal 135A only when all of FG cells 110-1 to 110-N are properly unprogrammed. Conversely, when one or more of FG cells 110-1 to 110-N fails to store the proper charge, wired NOR circuit 130A generates a "negative" single-bit cell test result signal 135A.

In accordance with an aspect of the present invention, for characterization purposes (i.e., the initial evaluation of a correct design implementation), bias voltage $V_{BIAS-A}$ is varied by means of varying supply (system) voltage $V_{DD}$. Varying bias voltage $V_{BIAS-A}$ enables a more accurate evaluation of the unprogrammed threshold voltages, and thus the upgrogrammed "charge", of FG cells 110-1 to 110-N, without requiring the use of additional device pins. In one embodiment, system voltage $V_{DD}$ is swept from a high to low voltage while test result signal 135A is monitored. The supply voltage at which the wired NOR test result signal 135A goes low is proportional to the highest of all EPROM cell thresholds. However, for production testing, this method takes too long, so a single measurement "go/no-go" test method is utilized that involves applying a fixed predetermined supply $V_{DD}$, thereby generating a predetermined bias voltage bias voltage $V_{BIAS-A}$, and reading signal 135A.

Figure 5:
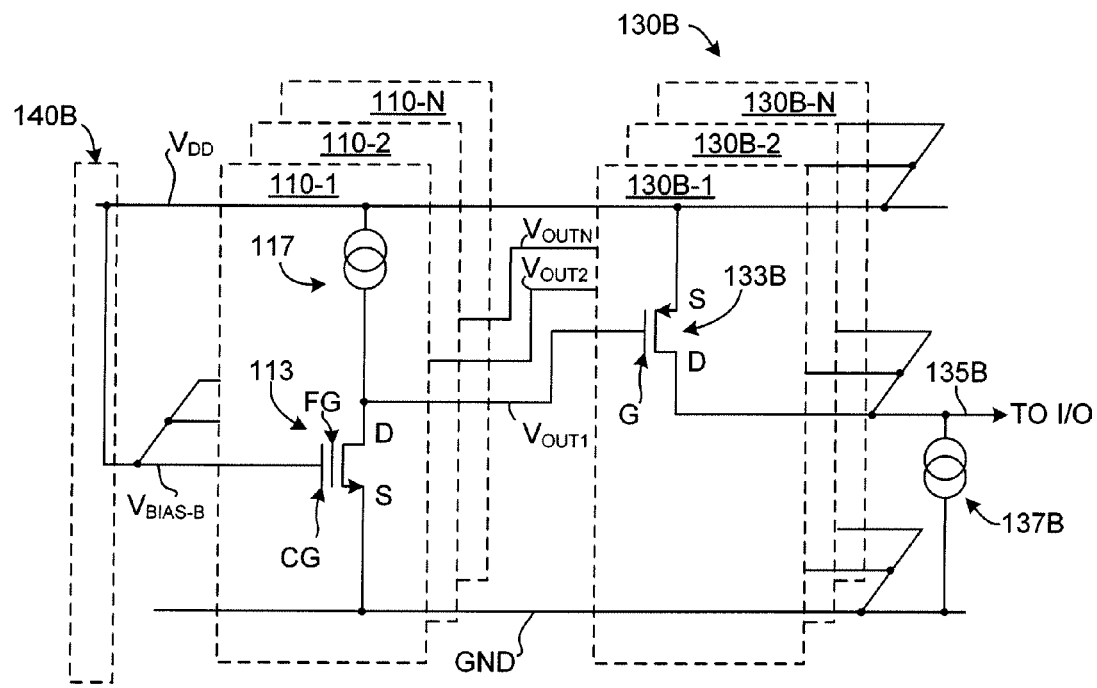
FIG. 5 is a simplified circuit diagram depicting a portion of the IC of FIG. 2 during a second portion of the test procedure of FIG. 3.

FIG. 5 shows a second configuration of IC 100 during the "all 1" test, which is to evaluate the worst case programmed threshold voltage of all FG cells 110-1 to 110-N. In this embodiment, a reference source 140B is implemented that produces a desired reference bias voltage $V_{BIAS-B}$ (i.e., $V_{DD}$) that is transmitted to control gate CG of each FG cell 110-1 to 110-N by way of switch SW1 (which is shown in FIG. 2, but omitted in FIG. 5 for clarity). To perform the "all 1" test, wired logic circuit 130B comprises a wired NAND gate 130B having multiple gates 130B-1 to 130B-N, each corresponding to an associated FG cell 110-1 to 110-N of embedded EPROM 110. Each gate 130B-1 to 130B-N (e.g., gate 130B-1) includes a transistor (e.g., 133A) having a gate terminal G coupled to the drain D of an associated FG cell (e.g., 110-1), a source S connected to system voltage $V_{DD}$, and a drain D connected to a common node 135B, which is connected to ground potential GND by way of a shared current source 137B. Under these conditions, with all of FG cells 110-1 to 110-N coupled to test bias voltage $V_{BIAS-B}$, each FG cell transmits an output signal $V_{OUT1}$ to $V_{OUTN}$ to wired NAND circuit 130B that is determined by the programmed charge stored on its floating gate FG, and wired NAND circuit 130B generates a "positive" single-bit cell test result signal 135B only when all of FG cells 110-1 to 110-N are properly programmed. Conversely, when one or more of FG cells 110-1 to 110-N fails to store the proper charge, wired NAND circuit 130B generates a "negative" single-bit cell test result signal 135B.

Similar to the "all 0" test (described above), the "all 1" test is performed using either a varying supply/bias voltage (e.g., during design evaluation), or a fixed supply/bias voltage (e.g., during production testing). During design evaluation, with all FG cells 110-1 to 110-N in a programmed state, supply voltage $V_{DD}$ is swept from a high to a low voltage and signal 135B from wired NAND circuit 130B is monitored. The supply voltage at which signal 135B goes low is equal to the lowest of all the programmed EPROM cell thresholds.

Figure 6:
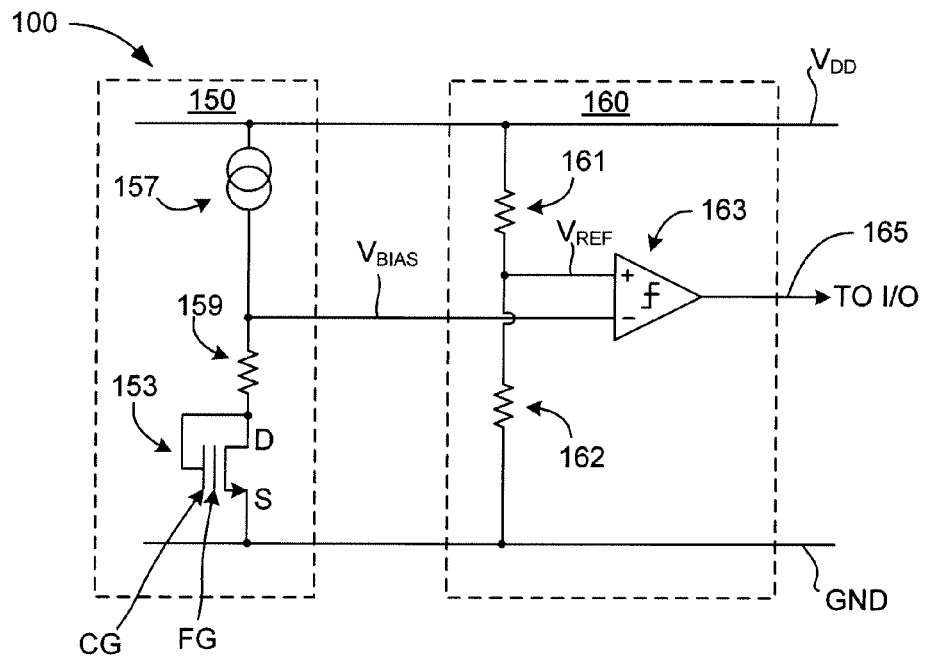
FIG. 6 is a simplified circuit diagram depicting a portion of the IC of FIG. 2 during a third portion of the test procedure of FIG. 3.

FIG. 6 shows a portion of IC 100 associated with testing a bias signal $V_{BIAS}$ generated by reference cell 150. Reference cell 150 includes a FG transistor 153 and current source 157 that are substantially identical to the FG transistors and current sources of embedded EPROM 110, and also includes a resistor 159 connected between current source 157 and FG cell 153. In addition, the control gate CG of FG transistor 153 is connected to its drain terminal D. FG transistor 153 remains unprogrammed at all times, and provides a bias voltage $V_{BIAS}$ that is ideally higher than the threshold voltage of each unprogrammed FG cell 110-1 to 110-N, but lower than the threshold of each programmed FG cell 110-1 to 110-N. To verify that the bias voltage $V_{BIAS}$ is generated at the desired voltage level, reference cell 150 is coupled to bias testing circuit 160, which in this case includes a voltage divider formed by resistors 161 and 162 to generate a predetermined reference voltage $V_{REF}$, and a comparator 163 having a non-inverting input terminal connected to receive reference voltage $V_{REF}$, and an inverting input terminal coupled to receive bias voltage $V_{BIAS}$ from reference cell 150. To test the correct level of the bias signal $V_{BIAS}$, supply voltage $V_{DD}$ is supplied with two sequential voltage levels that produce two corresponding reference voltages $V_{REF}$, which are compared to bias signal $V_{BIAS}$ with use of comparator 163. These two reference voltage levels represent the predetermined extremes of bias signal $V_{BIAS}$ as allowed by design. The higher and lower reference voltage levels should yield a logic "1" and a logic "0", respectively, on the I/O line 165, which during this test is passed on to test system 90. Failure to yield a logic "1" and a logic "0" signifies bias signal $V_{BIAS}$ is outside the desired voltage levels, on which basis the host IC device will fail the test.

Similar to the "all 0" and "all 1" tests (described above), the reference (bias) voltage test is performed using either a varying supply/reference voltage (e.g., during design evaluation), or a fixed supply/reference voltage (e.g., during production testing).

In all three circuit configurations described above with reference to FIGS. 4-6, the power supply voltage is swept as an input voltage during design evaluation (or switched between predetermined fixed voltage levels during production testing), and a single bit is used as a logical output for each test. This keeps the on-chip hardware requirements to a minimum thus minimizing die size and therefore cost. Using the results from the three circuit configurations and related evaluation methods described above, the worst case voltage margin of the all FG cells 110-1 to 110-N of embedded EPROM 110 is determined. Using this information, low margin parts can be screened out at production test so that the reliability of supplied products is improved.

Figure 7:
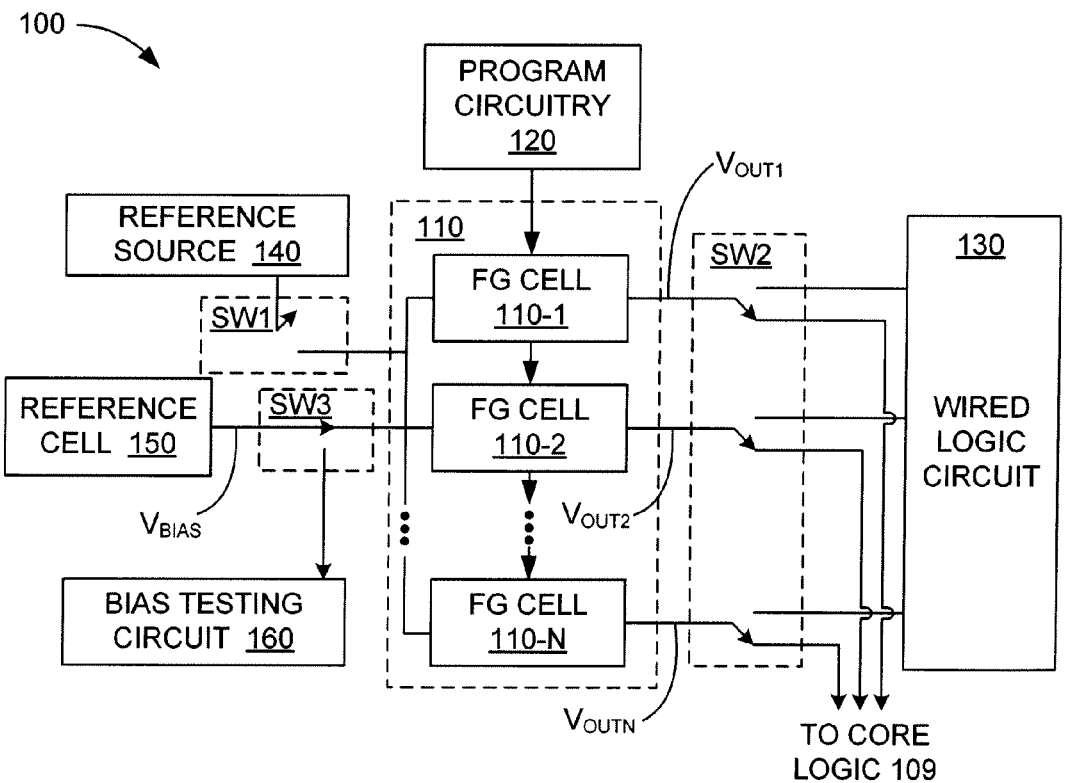
FIG. 7 is a simplified block diagram showing a portion of the IC of FIG. 1 after being reconfigured for normal operation.
Figure 8:
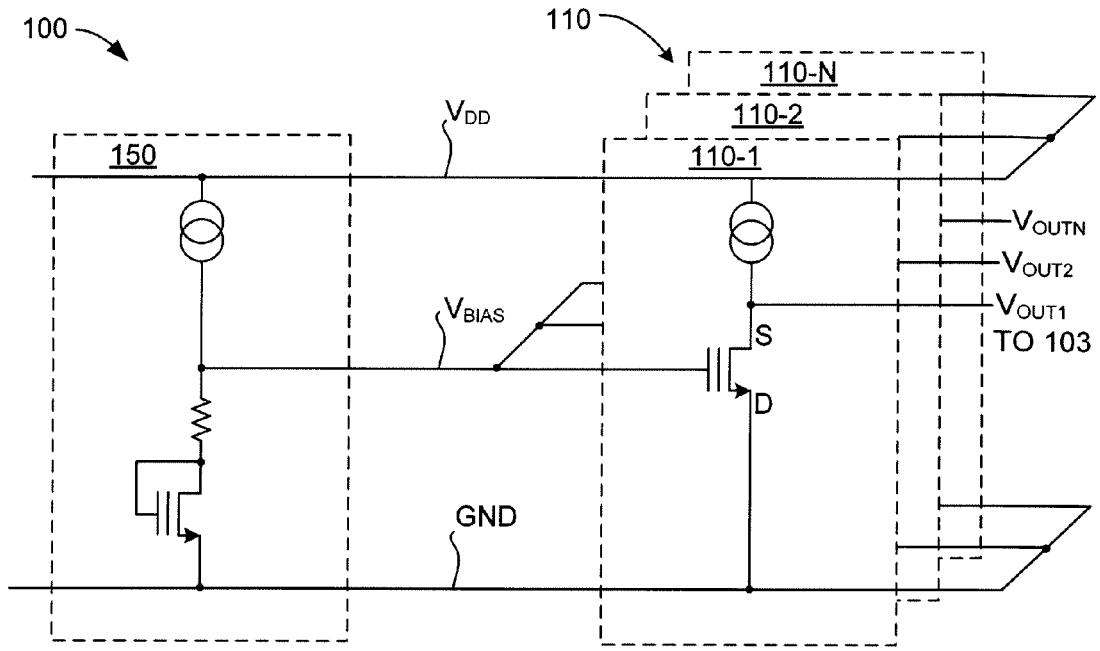
FIG. 8 is a simplified circuit diagram depicting a portion of the IC of FIG. 2 during normal operation.

Once the screening process is completed successfully, subsequent "normal" operation test of IC device 100 is performed as described below with reference to FIGS. 7 and 8. As shown in FIG. 7, prior to normal operation, switches SW1, SW2 and SW3 are programmed by serial connection to decoupled reference source 140 from embedded EPROM 110, to couple each FG cell 110-1 to 110-N to its associated core circuit component, and to connect reference cell 150 to the control gates of each FG cell 110-1 to 110-N. FIG. 8 shows reference cell 150 coupled to embedded EPROM 110 such that bias voltage $V_{BIAS}$ is supplied to the control gate of each FG cell 110-1 to 110-N, whereby output voltages $V_{OUT1}$ to $V_{OUTN}$ are generated in the manner described above with reference to FIG. 9.

Although the present invention has been described with respect to certain specific embodiments, it will be clear to those skilled in the art that the inventive features of the present invention are applicable to other embodiments as well, all of which are intended to fall within the scope of the present invention. For example, although the invention is described above with reference to wired NOR and NAND logic circuits, normal combinational logic circuits may also be used.

The invention claimed is:

1. A method for evaluating an embedded EPROM in an integrated circuit, the method comprising:
    applying predetermined voltages to a plurality of floating-gate cells of the embedded EPROM, whereby a floating gate of each of said plurality of floating-gate cells is subjected to a predetermined programming/unprogramming potential;
    after de-asserting the predetermined voltages, coupling a control gate of each said of said floating-gate cells to a predetermined test bias voltage, and coupling an output terminal of each said of said floating-gate cells to a logic circuit, whereby each said of said floating-gate cells transmits an output signal to said logic circuit in response to said predetermined test bias voltage, wherein the logic circuit includes means for generating a single-bit cell test result signal having a first logic value when all of said plurality of floating-gate cells store a predetermined programmed/unprogrammed charge, and for generating said single-bit cell test result signal having a second logic value when one or more of said plurality of floating-gate cells fails to store said predetermined programmed/unprogrammed charge; and transmitting said single-bit cell test result signal out of said integrated circuit to an external test system.

2. The method according to claim 1,
wherein applying said predetermined voltages comprises unprogramming all of said plurality of floating-gate cells, and
wherein coupling said control gate of each of said floating-gate cells to said logic circuit comprises coupling said control gates to a wired NOR cell.

3. The method according to claim 1,
wherein applying said predetermined voltages comprises programming all of said plurality of floating-gate cells, and
wherein coupling said control gate of each said of said floating-gate cells to said logic circuit comprises coupling said control gates to a wired NAND cell.

4. The method according to claim 1, further comprising:
coupling a reference cell to a bias testing circuit and adjusting a system voltage of said integrated circuit such that a bias voltage generated by the reference cell is sequentially compared against a first predetermined reference voltage and a second predetermined reference voltage, wherein the bias testing circuit includes means for generating a single-bit bias test result signal having a first logic value when said bias voltage is greater than said first predetermined reference voltage, for generating said single-bit bias test result signal having a second logic value when said bias voltage is less than said first predetermined reference voltage, for generating said single-bit bias test result signal having the second logic value when said bias voltage is greater than said second predetermined reference voltage, and for generating said single-bit bias test result signal having the first logic value when said bias voltage is less than said second predetermined reference voltage.

5. An integrated circuit comprising:
a core circuit;
an embedded EPROM including a plurality of floating-gate cells, each floating gate cell having an output terminal that is selectively couplable to a corresponding portion of said core circuit;
a logic circuit having a plural of input terminals and a single output terminal;
means for applying predetermined voltages to a plurality of floating-gate cells of the embedded EPROM, whereby a floating gate of each of said plurality of floating-gate cells is subjected to a predetermined programming/unprogramming potential;
means for coupling a control gate of each of said floating-gate cells to a predetermined test bias voltage, and for coupling an output terminal of each of said floating-gate cells to an associated said input terminal of said logic circuit, whereby all of said of said floating-gate cells simultaneously transmit associated output signals to said logic circuit in response to said predetermined test bias voltage,
wherein the logic circuit includes means for generating on said single output terminal a single-bit cell test result signal having a first logic value when all of said plurality of floating-gate cells store a predetermined programmed/unprogrammed charge, and for generating said single-bit cell test result signal having a second logic value when one or more of said plurality of floating-gate cells fails to store said predetermined programmed/unprogrammed charge.

6. The integrated circuit according to claim 5, further comprising means for transmitting said single-bit cell test result signal out of said integrated circuit to an external test system.

7. The integrated circuit according to claim 5,
wherein said means for applying said predetermined voltages comprises means for unprogramming said plurality of floating-gate cells, and
wherein said logic circuit comprises a wired NOR cell.

8. The integrated circuit according to claim 5,
wherein said means for applying said predetermined voltages comprises programming all of said plurality of floating-gate cells, and
wherein said logic circuit comprises a wired NAND cell.

9. The integrated circuit according to claim 5, further comprising:
means for coupling a reference cell to a bias testing circuit and adjusting a system voltage of said integrated circuit such that a bias voltage generated by the reference cell is compared against a first predetermined reference voltage, wherein the bias testing circuit includes means for generating a single-bit bias test result signal having a first logic value when said bias voltage is greater than said first predetermined reference voltage, for generating said single-bit bias test result signal having a second logic value when said bias voltage is less than said first predetermined reference voltage, for generating said single-bit bias test result signal having the second logic value when said bias voltage is greater than said second predetermined reference voltage, and for generating said single-bit bias test result signal having the first logic value when said bias voltage is less than said second predetermined reference voltage.

10. The integrated circuit according to claim 5, wherein the logic circuit comprises one of a DC-to-DC converter circuit and a low dropout regulator (LDO) circuit.

* * * * *

UNITED STATES PATENT AND TRADEMARK OFFICE
CERTIFICATE OF CORRECTION

| | |
|---|---|
| PATENT NO. | : 7,602,646 B1 |
| APPLICATION NO. | : 12/056570 |
| DATED | : October 13, 2009 |
| INVENTOR(S) | : Paul Wilson et al. |

It is certified that error appears in the above-identified patent and that said Letters Patent is hereby corrected as shown below:

Column 8, line 64, delete "said" (first occurrence).

Column 8, line 67, delete "said" (first occurrence).

Column 9, line 25, delete "said" (second occurrence).

Column 9, line 53, amend "plural" to -- plurality --.

Column 10, line 8, delete "of said" (first occurrence).

Signed and Sealed this

Eighth Day of December, 2009

David J. Kappos
*Director of the United States Patent and Trademark Office*